(12) United States Patent
Whitcomb

(10) Patent No.: US 6,468,022 B1
(45) Date of Patent: Oct. 22, 2002

(54) EDGE-GRIPPING PRE-ALIGNER

(75) Inventor: Preston Whitcomb, Hull, MA (US)

(73) Assignee: Integrated Dynamics Engineering, Inc., Westwood, MA (US)

( * ) Notice: Subject to any disclaimer, the term of this patent is extended or adjusted under 35 U.S.C. 154(b) by 16 days.

(21) Appl. No.: 09/609,342

(22) Filed: Jul. 5, 2000

(51) Int. Cl.$^7$ ............................................. B65G 49/07
(52) U.S. Cl. ...................... 414/757; 414/783; 414/936; 414/941
(58) Field of Search ................................ 414/757, 783, 414/936, 941; 294/106, 103.1

(56) References Cited

U.S. PATENT DOCUMENTS

| | | | | |
|---|---|---|---|---|
| 4,457,664 A | * | 7/1984 | Judell et al. ................. | 414/779 |
| 4,749,330 A | | 6/1988 | Hine ........................ | 414/744.5 |
| 4,770,590 A | * | 9/1988 | Hugues et al. .............. | 414/172 |
| 4,892,455 A | | 1/1990 | Hine ...................... | 414/416.03 |
| 5,102,291 A | | 4/1992 | Hine ......................... | 414/816 |
| 5,803,979 A | | 9/1998 | Hine et al. .................... | 134/2 |
| 5,810,935 A | * | 9/1998 | Lee et al. ................... | 118/728 |
| 5,851,041 A | * | 12/1998 | Anderson et al. ........... | 294/106 |
| 6,012,192 A | * | 1/2000 | Sawada et al. ................ | 15/77 |
| 6,256,555 B1 | | 7/2001 | Bacchi et al. ............... | 700/245 |
| 6,275,748 B1 | | 8/2001 | Bacchi et al. ............... | 700/275 |

FOREIGN PATENT DOCUMENTS

| | | | | |
|---|---|---|---|---|
| JP | 1-120032 | * | 5/1989 | ................. 414/936 |

OTHER PUBLICATIONS

Kensington Wafer Handler Described in Material of Kensington Laboratories Inc., Richmond, CA, 1986.*

* cited by examiner

*Primary Examiner*—Janice L. Krizek
(74) *Attorney, Agent, or Firm*—Fish & Richardson P.C.

(57) ABSTRACT

An apparatus for holding and orienting a wafer having an alignment feature, and including a movable robot arm; and an end effector attached to an end of the robot arm, the end effector including a gripping mechanism which during operation both holds the wafer and rotates it about an axis that is perpendicular to the plane of the wafer and a sensing element for detecting the alignment feature on the wafer as the gripping mechanism rotates the wafer past the sensing element.

16 Claims, 8 Drawing Sheets

EDGE-GRIPPING PRE-ALIGNER

TECHNICAL FIELD

This invention relates to end effectors for robotic handlers such as might be used in materials processing, e.g. semiconductor wafer processing.

BACKGROUND

Robotic handlers are commonly used to move materials, e.g. semiconductor wafers, between different stages of a wafer fabrication process. For example, robotic handlers might be used to move the wafer, from a plasma etch station in a cluster tool to a deposition station or from a manufacturing station to a testing station. At some stages of the manufacturing process, the wafer that is delivered by the robotic handler must be in a known orientation. For example, if the stage involves a masking process, the orientation of the wafer is critical since the mask must be aligned with the previously formed patterns on the wafer. To achieve the proper alignment, the robotic handler typically moves the wafer to something referred to as a pre-aligning station. After the wafer is deposited at this station, the pre-aligner positions the wafer and rotates it to a predetermined orientation. Then, the robotic handler picks up the oriented wafer and moves it to the next processing stage.

A typical robotic handler includes an end effector and a robotic arm. The end effector is the part of the robotic handler that holds the wafer. The arm includes the mechanical mechanisms that are used to move the end effector and the wafer which it holds to the desired location.

SUMMARY

In general, in one aspect, the invention is an apparatus for holding and orienting a wafer having an alignment feature. The apparatus includes a movable robot arm; and an end effector attached to an end of the robot arm. The end effector includes a gripping mechanism which during operation both holds the wafer and rotates it about an axis that is perpendicular to the plane of the wafer and a sensing element for detecting the alignment feature on the wafer as the gripping mechanism rotates the wafer past the sensing element.

Other embodiments of the invention include one or more of the following features. The gripping mechanism includes a first contacting member, a second contacting member, and a drive element which increases and decreases the space between the first and second contacting members in response to a control signal. The first and second contacting members are arranged to grip opposing edges of the wafer. The first contacting member includes a first roller element and the second contacting member includes second and third roller elements separated in space from each other. The gripping mechanism also includes an mechanical actuator which is coupled to and moves the first roller element towards and away from the second and third roller elements. The first roller element has a cylindrically-shaped outer surface with a circumferential groove formed therein. The first, second and third roller elements are arrayed in a common plane and have parallel axes of rotation. The gripping mechanism further includes a drive motor which rotates the first roller element.

Other embodiments also include the following additional features. The sensing element includes a light emitter and a light detector. The light emitter and the light detector are positioned to lie on opposite sides of the wafer when the wafer is being held by the gripping mechanism. The sensor senses the orientation by detecting a feature on the perimeter of the wafer as the wafer is rotated.

The invention has one or more of the following advantages. The end effector allows a user to align the wafer without transferring the wafer to a separate pre-aligner. This eliminates the loss in alignment precision that might otherwise result from transferring the wafer from the pre-aligner to the end-effector. This also tends to reduce or eliminate possible contamination to the wafer that might tend to result from the additional contact with the pre-aligner. Eliminating the wafer transfers from the robot arm to the pre-aligner and back also saves time, thus increasing processing throughput.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1A:
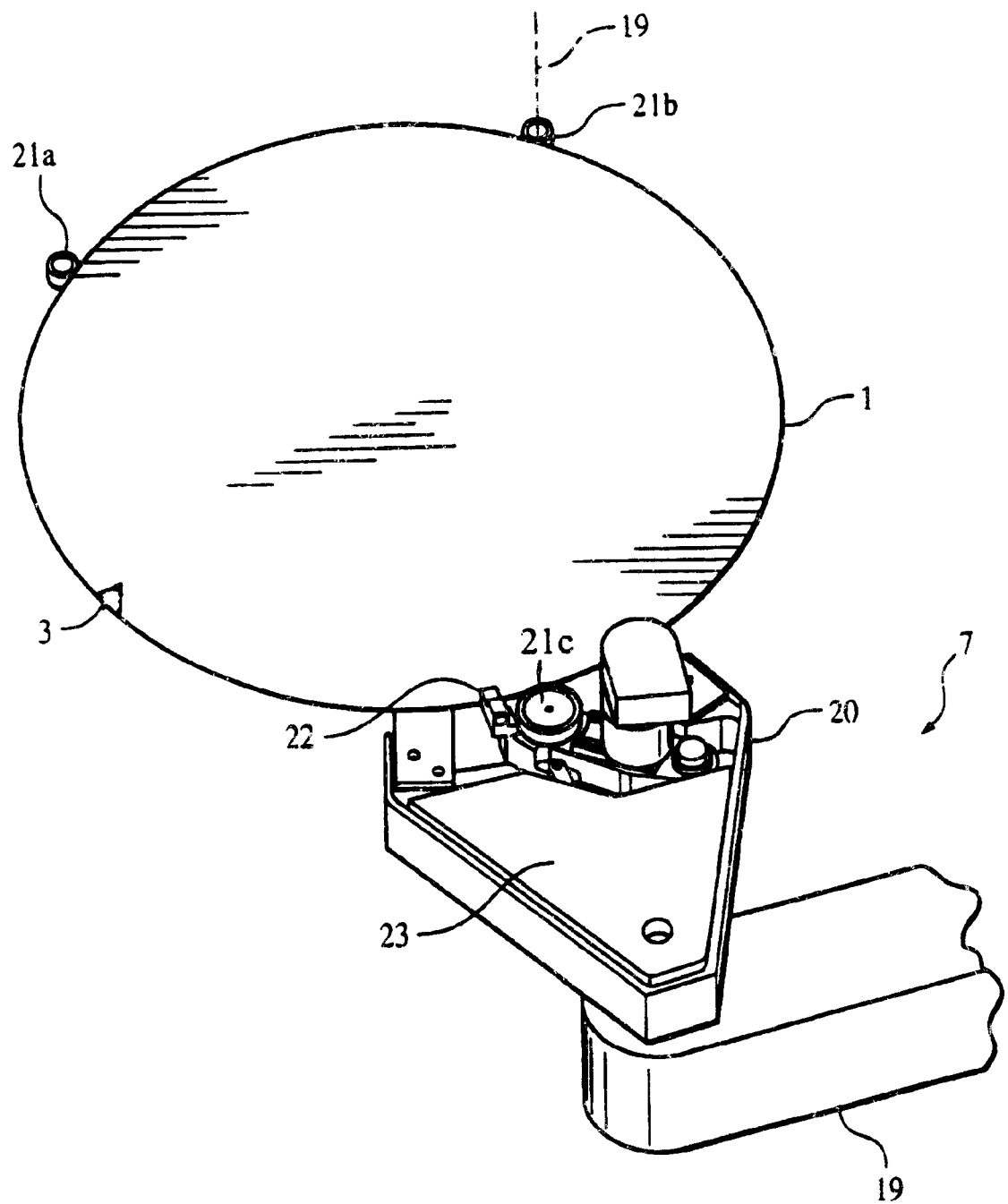
FIG. 1A shows a robotic handler holding a wafer.
Figure 1B:
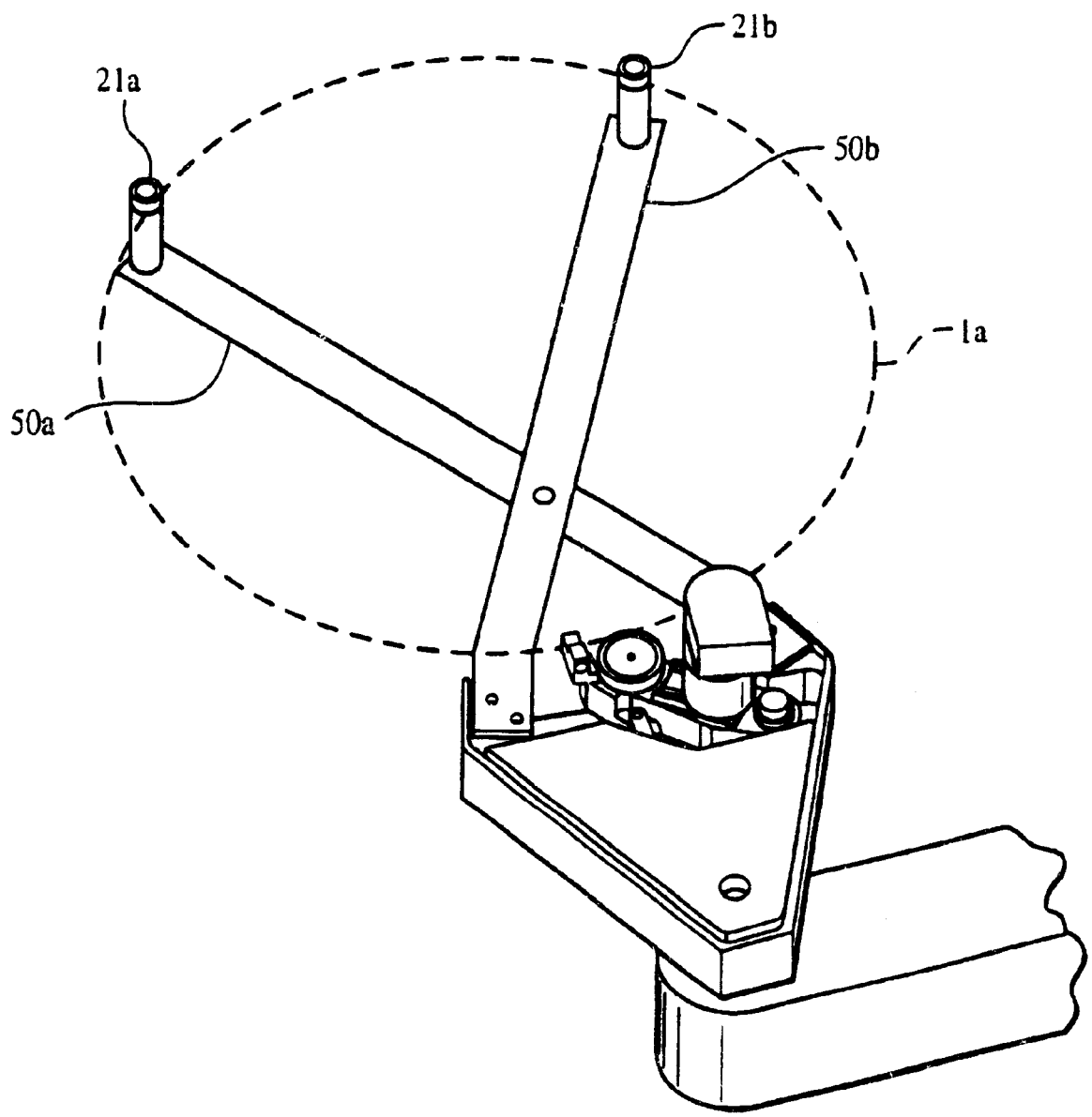
FIG. 1B shows the robotic handler of FIG. 1A, without the wafer.

Referring to FIGS. 1A and 1B, a robotic handler 7 for moving a wafer 1 has two primary components, namely, a robot arm 19 and an end effector 20 attached to one end of robotic arm 19. End effector 20 is used to grab and hold wafer 1 and robotic arm 19, which includes various motors and mechanical mechanisms not shown in the figures, moves end effector 20 and the wafer that it holds within its grasp.

Wafer 1 is typically a circular disk of semiconductor material, e.g. silicon. It generally is of uniform thickness and has an alignment feature 3 at one location on its circumference. Alignment feature 3 is typically a flat portion or it is a v-shaped notch, as depicted in FIG. 1. The alignment feature serves as a reference that can be used to align the wafer to a known orientation. As will be described in greater detail below, end effector 20 has a drive mechanism for rotating wafer 1 as it is being held by the end effector and it has sensor circuitry for detecting the alignment feature and thereby determining and establishing the orientation of wafer 1.

Figure 3:
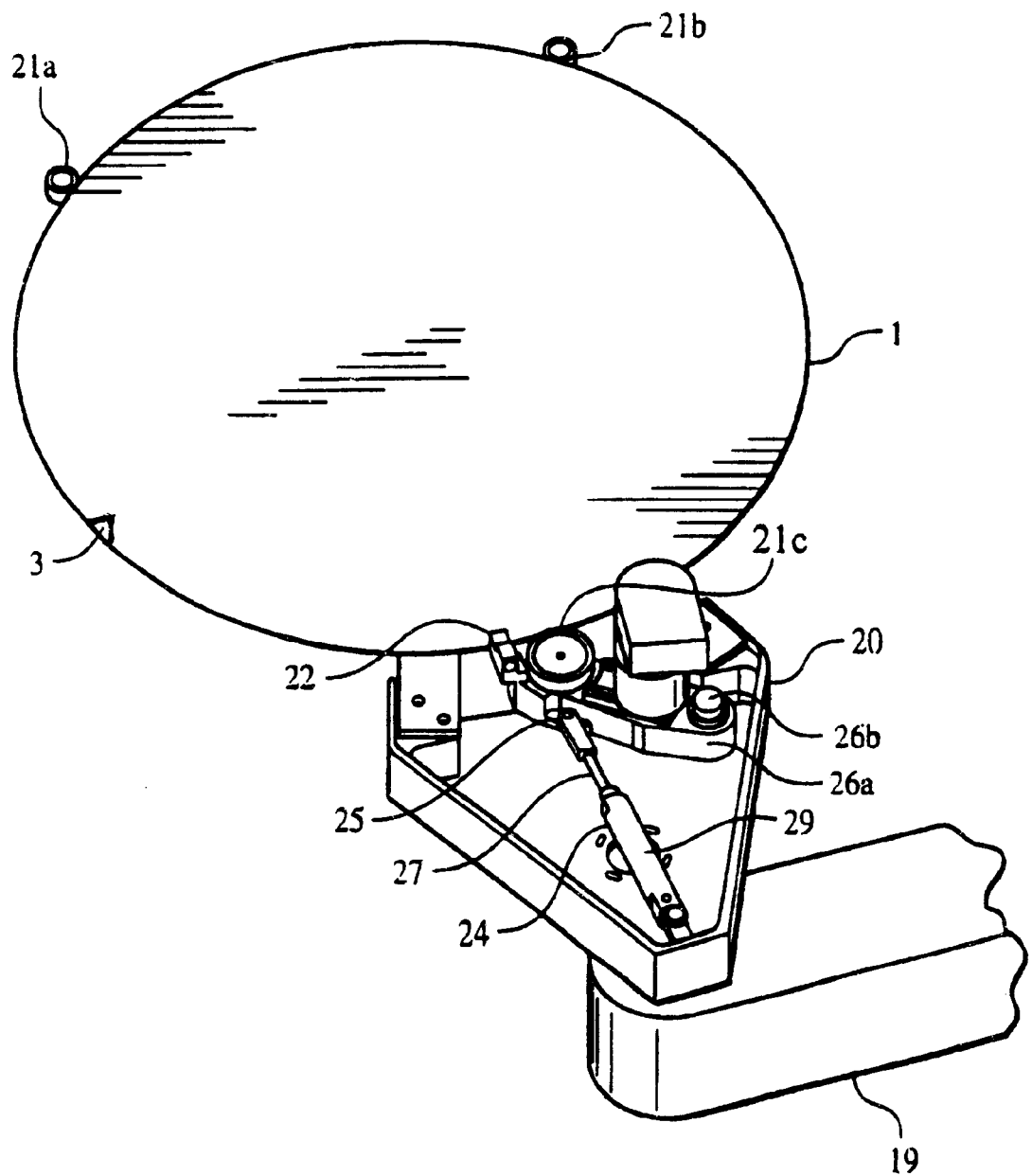
FIG. 3 shows the robotic handler of FIG. 1A with the control printed circuit board removed to reveal inner components of the end effector mechanism.

In the described embodiment, the drive mechanism includes two idler rollers 21a and 21b and a drive roller 21c. Idler rollers 21a and 21b are mounted at the remote ends of corresponding supporting rods 50a and 50b. Rollers 21a and 21b are supported by bearings (not shown) on corresponding support pins so that they freely rotate. Referring to FIG. 3, drive roller 21c is mounted on a drive roller housing 26a.

More specifically, drive roller 21c is mounted on a shaft that is itself supported by bearings in the housing. The two idler rollers 21a and 21b and the drive roller 21c are arrayed in a common plane and have parallel axes of rotation.

Figure 4:
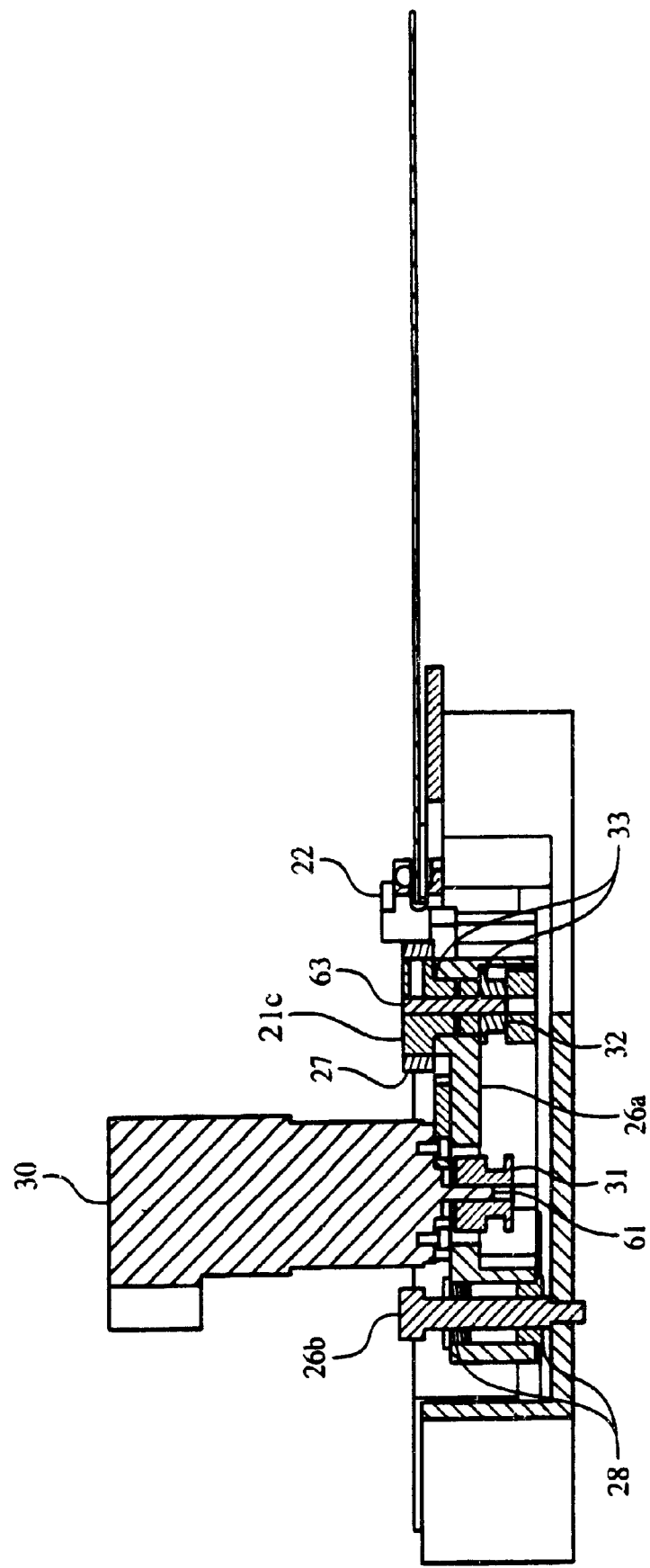
FIG. 4 is a vertical cross section of the end effector of FIG. 1A.

Referring to FIGS. 3 and 4, drive roller housing 26a pivots at one end about a pin 26b. A gripper actuator cylinder 25 (e.g. a linear motor or a hydraulically operated device) includes a shaft 27, which moves in and out of a cylinder 29 in response to a control signal. The far end of actuator shaft 27 is connected to housing 26a by means of a pin 25. Thus, the in and out movement of shaft 27 of actuator 24 in response to the control signal causes housing 26a to rotate about pin 26b and, in turn, causes drive roller 21c to move, respectively, towards and away from the two idler rollers 21a and 21b.

When actuator shaft 27 is retracted into cylinder 29, the separation between drive roller 21c and the other two rollers 21a and 21b becomes larger enough to accept wafer 1. Once wafer is located within an area defined by the three rollers 21a–c, actuator shaft 27 is extended out of cylinder 24, thereby pushing drive roller 21c toward the other two rollers until all three rollers contact the outer periphery of and hold wafer 1. Rollers 21a–c are positioned so that they contact the periphery of wafer 1 at locations which are separated sufficiently from each other so that wafer readily slides into the grasp of the rollers and is held securely there.

Figure 2:
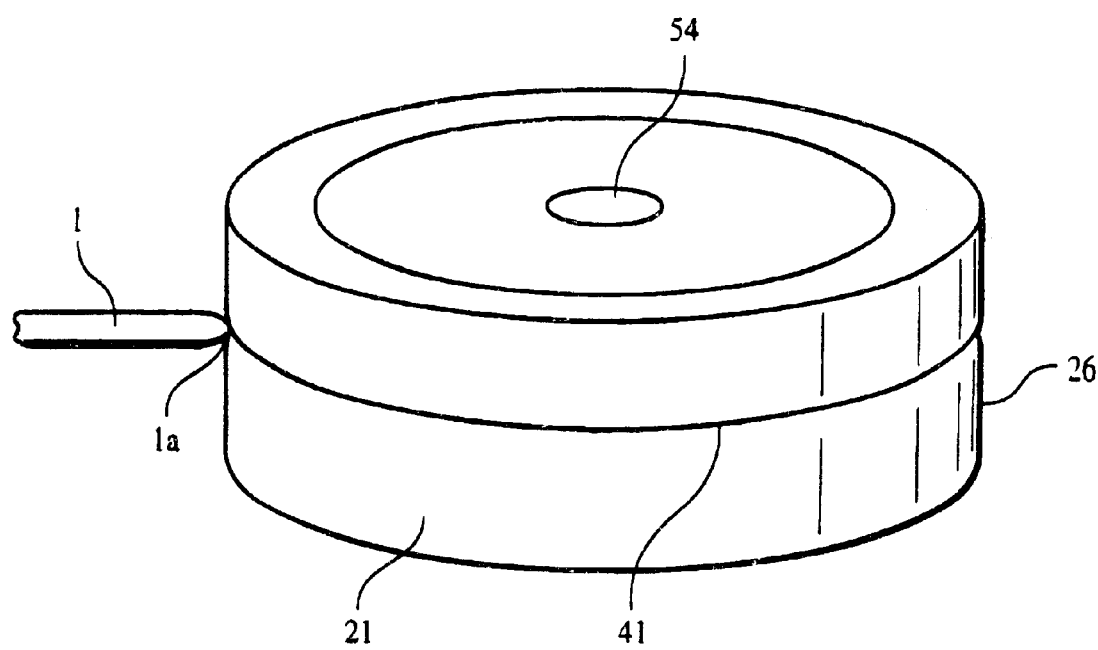
FIG. 2 shows details of the rollers shown in FIG. 1A.

The construction of roller 21a is shown in greater detail in FIG. 2. The other two rollers 21b and 21c are constructed similarly. Roller 21a has a substantially cylindrical outer rim 26, which includes a positioning groove 41 formed around its outer circumference. When the rim of the roller is brought into contact with the periphery of the wafer, positioning groove 41 receives and holds the edge of the wafer thereby preventing the wafer from sliding either up or down on the roller. Since all three rollers 21a–c have a similar positioning groove, when the rollers are contacting the periphery of the wafer and the wafer sits in the corresponding positioning grooves of the three rollers, the plane of the wafer is fixed and precisely determined. The outer surfaces of the rollers are made form a plastic that does not contaminate the wafer.

As is shown more clearly in FIG. 4, the mechanism for rotating the drive roller 21c includes a drive motor 30 that is also mounted on drive housing 26a. Drive motor 30 is a servo-controlled motor that, has a drive shaft 61, which extends down through housing 26a. Attached to the other end of shaft 61, below housing 26a, there is a drive motor pulley 31. Drive roller 21c is mounted on another shaft 63 that is rotatably supported in housing 26a by bearings 33. At the other end of drive roller shaft 63 there is another pulley 32. The two pulleys 31 and 32 are connected to each other by a belt (not shown). Thus, drive motor 30 causes drive roller 21c to rotate. And when drive roller 21c is contacting the periphery of wafer, it causes the wafer to rotate within the grasp of the three rollers.

Figure 5:
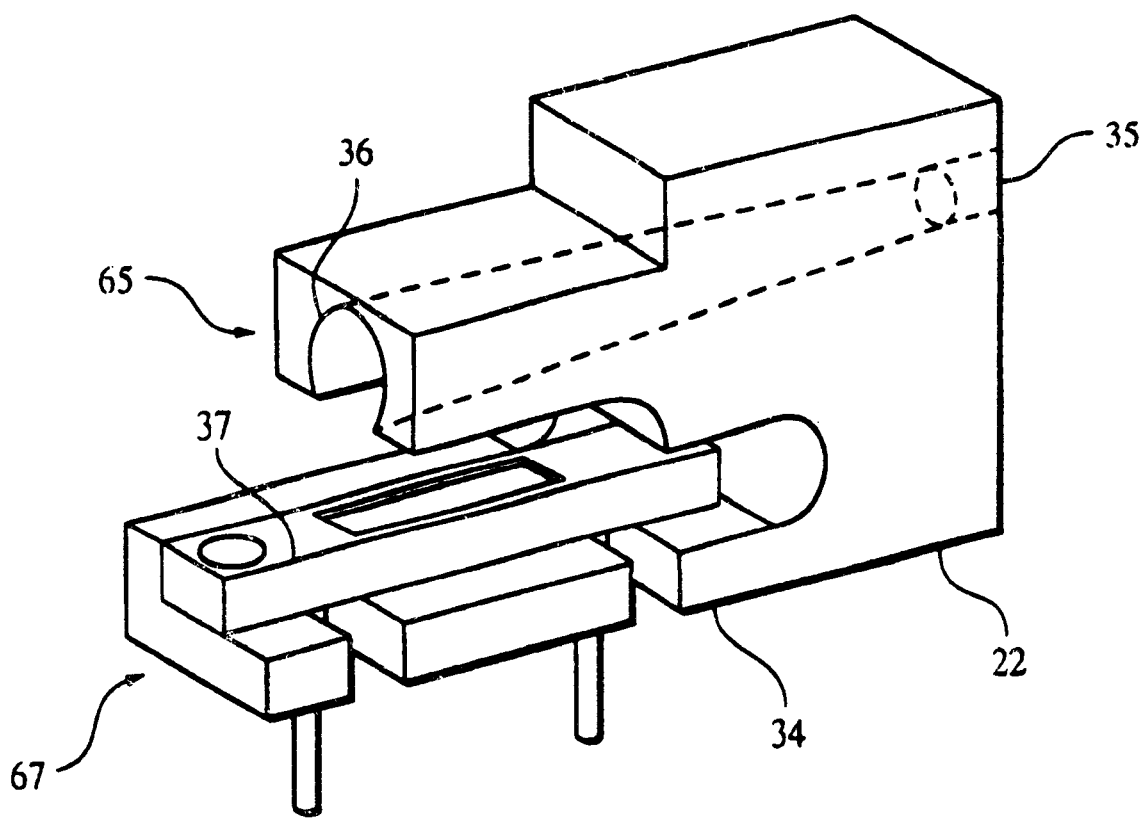
FIG. 5 shows the details of the sensor of FIG. 1A.

The end effector 20 has an optical sensing system 21 (shown in greater detail FIG. 5) for detecting the presence of the alignment feature 3 on the wafer 1 as it passes by while the wafer is being rotated. Sensing system 21 has an upper arm 65 that contains the light emitting components and a lower arm 67 that contains the light detecting components. When the wafer is being held by rollers 21a–c, the edge of the wafer lies between upper and lower arms 65 and 67. Upper arm 65 includes a light emitting diode 35 (shown in phantom) that is used to illuminate the edge of the wafer. The light from diode 35 passes to a collimator optic 36 that, in turn, directs the light down toward the wafer. The aperture of collimator optic 36 is narrow and long, with its longer dimension oriented perpendicular to the edge of the wafer. Lower arm 67 includes a silicon diode receiver 37 which has a detecting window that is also long and narrow, like collimator optic 36, and is aligned with the aperture of the collimating optic 36. The signal generated by diode receiver 37 is proportional to the amount of light from collimator optic 36 that reaches it.

When wafer 1 rotated within the grasp of end effector 20, the edge of the wafer passes between the light emitting and light detecting components. Optical housing 22 is positioned so that the edge of the wafer prevents some of the light from collimator optic 36 from reaching diode receiver 37. When the alignment feature passes between the light emitting and light detecting components, more light is allowed to reach diode receiver 37 and its output signal increases. And as the alignment feature moves past the sensor, the signal decreases to its previous value. Thus, by monitoring the output signal of the diode receiver, the electronics can detect the presence of the alignment feature, can determine its precise angular location as a function of the rotational position of the wafer, and can precisely align the angular orientation of the wafer.

The techniques for determining the angular location of the alignment feature and then aligning the wafer based on that information are well known to persons skilled in the art. Such techniques are typically used in connection with standalone pre-aligners of the type briefly mentioned earlier. An example of one such technique that can be used is described in U.S. Pat. No. 4,457,664, entitled "Wafer Alignment Station" and incorporated herein by reference.

Referring back to FIG. 1, end effector 20 also includes a control processor on a printed circuit board 23 which implements the electrical control functions that are necessary. For example, it generates the control signals for the drive motor and the actuator and it analyzes the sensing signal to determine and establish the orientation of the alignment feature of the wafer.

Figure 6:
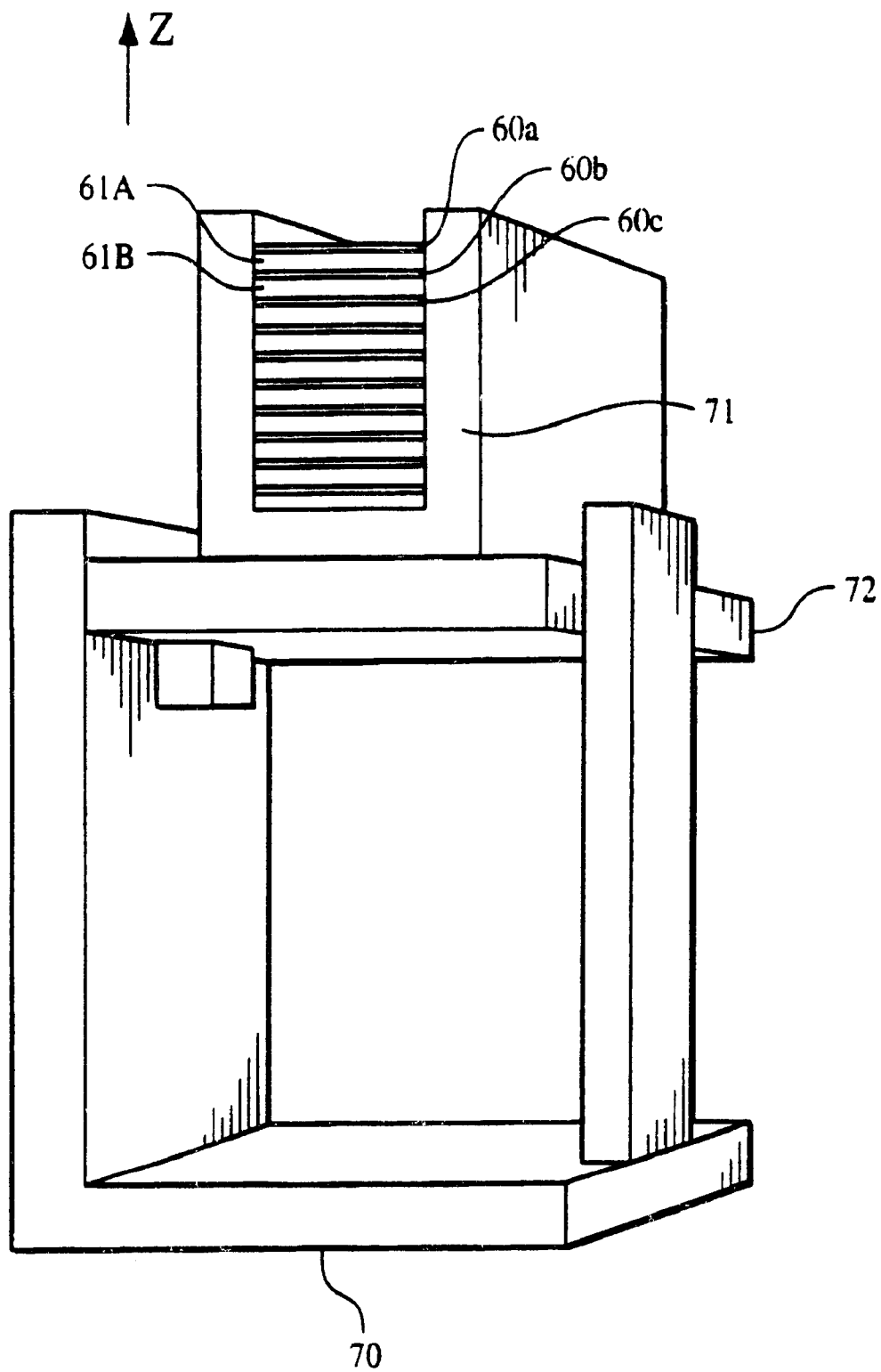
FIG. 6 shows a wafer rack for holding the wafer of FIG. 1A.

Referring to FIG. 6, a typical use of the end effector is to grab wafers from a wafer storage rack 70 and then transfer them to a masking station (not shown). Generally, rack 70 has a wafer holder 71 mounted on a platform 72 that can be displaced in a direction z. The wafer holder holds wafers 60a–c, which are spaced apart by spaces 61a, 61b.

Figure 7:
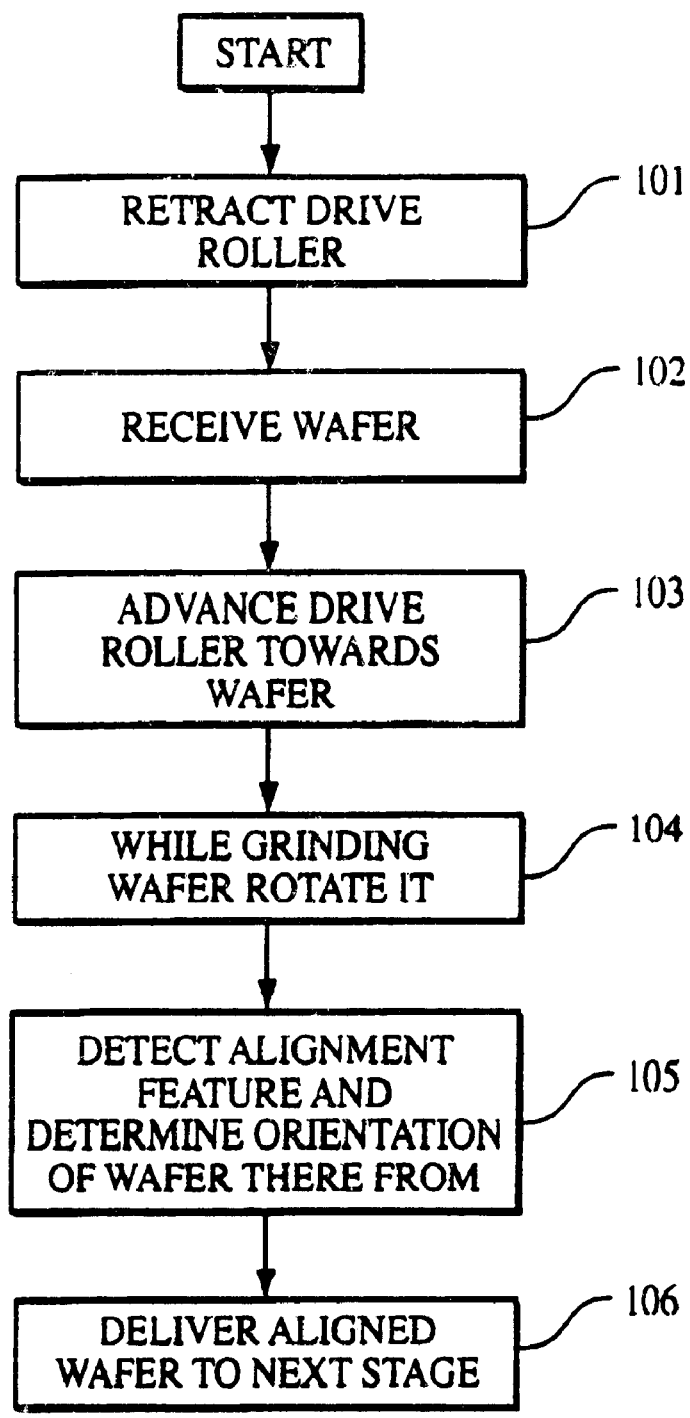
FIG. 7 is a flow chart of the operation of the end effector.

Referring to FIG. 7, robotic handler 7 operates as follows to remove wafers from rack 70 and align them. Robotic handler inserts end effector 20 in the space below the wafer that will be grabbed. At some point in the operation, the control processor retracts the drive roller thereby opening up the space for receiving the wafer from the rack (block 101). When the end effector is in position and the roller is retracted enough to provide enough space for receiving the wafer, the platform holding the wafer lowers the wafer until it is within the plane of the three rollers on the end effector (block 102). When the wafer is aligned with the grooves of the rollers, the control processor then advances the driver roller towards idler rollers until the rollers snugly grip outside periphery (i.e., the edge) of the wafer (block 103). The robot arm can then move the wafer out of the wafer holder.

After the rollers have grabbed the wafer, the control processor uses the drive motor to rotate the wafer (block 104). As the end effector is rotating the wafer, it also monitors the diode receiver signal to detect the presence of the alignment feature and determine its precise angular orientation relative to the rotation of the wafer (block 105). The control processor uses the information obtained from the sensor to then orient the wafer such that the alignment feature is positioned in a predetermined angular position (block 106).

A number of embodiments of the invention have been described. Nevertheless, it will be understood that various modifications may be made without departing from the spirit and scope of the invention. For example, other kinds of sensors may be used to sense the orientation of the wafer. The sensors may detect the presence of the alignment feature by physical contact, magnetic fields, or capacitance, just to name a few possible ways. In addition, more than three rollers may be used to grasp the periphery of the wafer and the transport mechanism for rotating the wafer. Alternatively, other moving surfaces, such as a belt, may be used instead of rollers. Accordingly, other embodiments are within the scope of the following claims.

What is claimed is:

1. An apparatus for holding and orienting a wafer having an alignment feature, said apparatus comprising:
   a movable robot arm; and
   an end effector attached to an end of the robot arm, said end effector including a gripping mechanism which during operation both holds the wafer and rotates it about an axis that is perpendicular to the plane of the wafer and a sensing element for detecting the alignment feature on the wafer as the gripping mechanism rotates the wafer past the sensing element;
   wherein the gripping mechanism comprises a first contacting member, a second contacting member, and a drive element which increases and decreases the space between the first and second contacting members in response to a control signal.

2. The apparatus of claim 1 wherein the first and second contacting members are arranged to grip opposing edges of the wafer.

3. The apparatus of claim 1 further comprising a controller which during operation controls the end effector and causes the end effector to rotate the wafer.

4. The apparatus of claim 3 wherein the controller controls the end effector to cause the end effector to rotate the wafer while the robot arm is moving the wafer.

5. The apparatus of claim 1 wherein the sensing element comprises a light emitter and a light detector.

6. The apparatus of claim 5 wherein the light emitter and the light detector are positioned to lie on opposite sides of the wafer when the wafer is being held by the gripping mechanism.

7. The apparatus of claim 5 wherein the sensing element senses the orientation by detecting a feature on the perimeter of the wafer as the wafer is rotated.

8. The apparatus of claim 1 wherein the first contacting member comprises a first roller element.

9. The apparatus of claim 8 wherein the gripping mechanism further comprises a drive motor which rotates the first roller element.

10. The apparatus of claim 8 wherein the second contacting member comprises second and third roller elements separated in space from each other.

11. The apparatus of claim 5 wherein the gripping mechanism comprises a mechanical actuator which is coupled to and moves the first roller element towards and away from the second and third roller elements.

12. The apparatus of claim 10 wherein the first roller element has a cylindrical-shaped outer surface with a circumferential groove formed therein.

13. The apparatus of claim 10 wherein the first, second and third roller elements are arrayed in a common plane and have parallel axes of rotation.

14. An apparatus for holding and orienting a wafer having an alignment feature, said apparatus comprising:
    a movable robot arm having a working end and a base end; and
    an end effector attached to the working end of the robot arm, said end effector including a gripping mechanism which during operation both holds the wafer and rotates the wafer relative to the end effector and about an axis that is perpendicular to the plane of the wafer and a sensing element for detecting the alignment feature on the wafer as the gripping mechanism rotates the wafer past the sensing element, wherein the robot arm is configured to move the wafer laterally relative to the axis, wherein the gripping mechanism comprises three contacting members which during operation contact the edges of the wafer, wherein the contacting members are separated in space from each other to hold the wafer.

15. The apparatus of claim 14 wherein one of the contacting members is a drive member and the gripping mechanism further comprises a drive motor which rotates the drive member.

16. The apparatus of claim 15 wherein the gripping mechanism further comprises:
    a mechanical actuator which is coupled to and moves the drive member towards and away from the other two contacting members.

\* \* \* \* \*